(12) United States Patent
Morgan et al.

(10) Patent No.: US 6,264,803 B1
(45) Date of Patent: Jul. 24, 2001

(54) APPARATUS AND METHOD FOR SPUTTERING

(76) Inventors: Steven V. Morgan, 253 Mark West Station Rd., Windsor, CA (US) 95492; Johan Vanderstraeten, Industriezone E.376 Laan 75-59, B-9800 Deinze (BE); Erwin Vanderstraeten, Industriezone E.376 Laan 75-59, B-9800 Deinze (BE); Guy Gobin, Industriezone E.376 Laan 75-59, B-9800 Deinze (BE)

( * ) Notice: Subject to any disclaimer, the term of this patent is extended or adjusted under 35 U.S.C. 154(b) by 0 days.

(21) Appl. No.: 08/796,197

(22) Filed: Feb. 7, 1997

(51) Int. Cl.⁷ .................................... C23C 14/34
(52) U.S. Cl. ................ 204/192.12; 204/298.21; 204/298.22
(58) Field of Search ............ 204/192.1, 192.12, 204/298.17, 298.19, 298.2, 298.21, 278.22, 298.23

(56) References Cited

U.S. PATENT DOCUMENTS 4,356,073 * 10/1982 McKelvey ................ 204/298.22
5,364,518 * 11/1994 Hartig et al. ............... 204/298.22
5,427,665 * 6/1995 Hartig et al. ............... 204/298.21
5,470,452 * 11/1995 Dickey et al. .............. 204/298.22

* cited by examiner

*Primary Examiner*—Nam Nguyen
*Assistant Examiner*—Rodney G. McDonald
(74) *Attorney, Agent, or Firm*—Larry D. Johnson

(57) ABSTRACT

Material utilization and process stability for a rotating cylindrical magnetron target used in a sputtering system are improved by incorporation of a second magnet structure or "race track", allowing the power density on the target surface to be reduced by approximately 50% for any given point where magnetic confinement of the plasma exists. Offsetting one race track relative to the other along the longitudinal axis of the target reduces the power density at each turn-around area (relative to the longitudinal area). Modestly increasing the target material thickness at the ends of the target allows nearly all of the material between the turn-around areas to be sputtered.

10 Claims, 3 Drawing Sheets

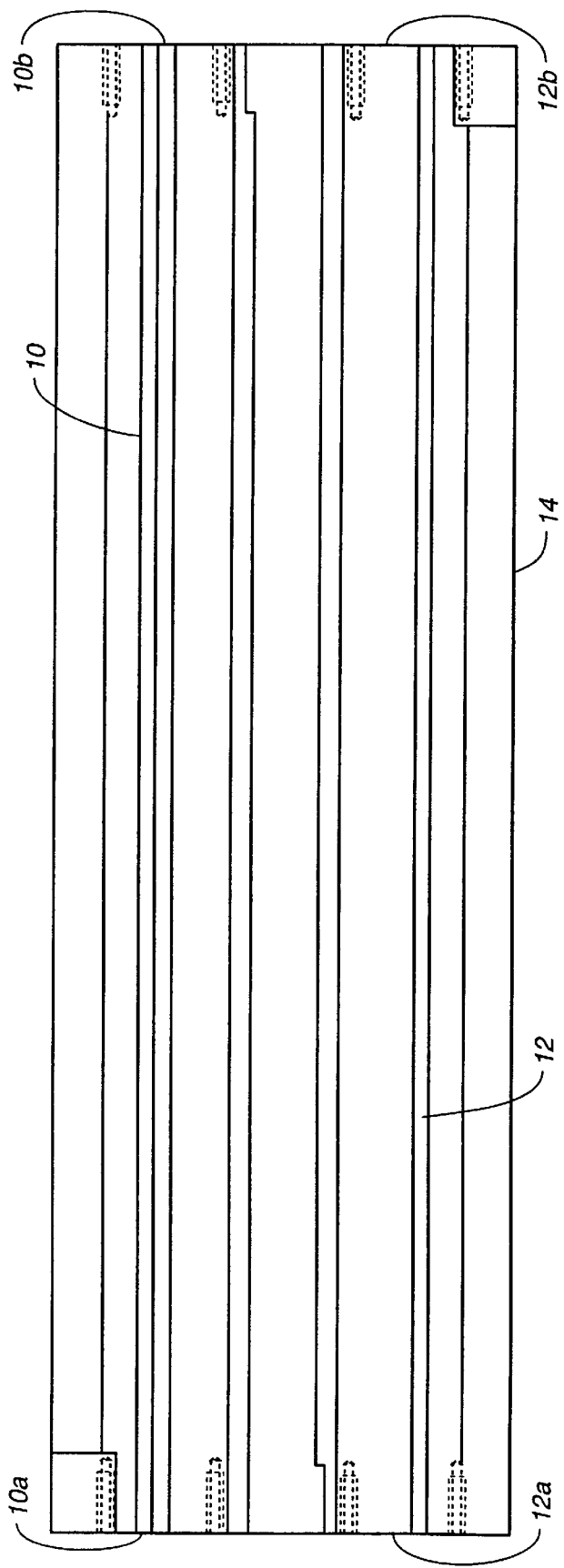
FIG._1

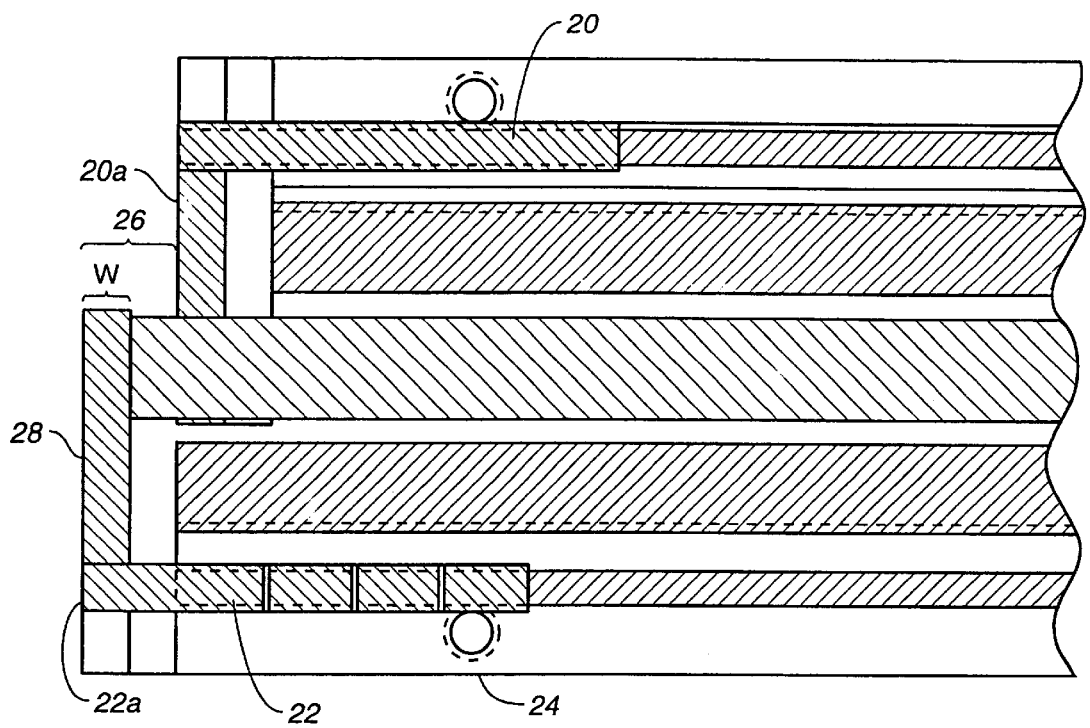
FIG._2
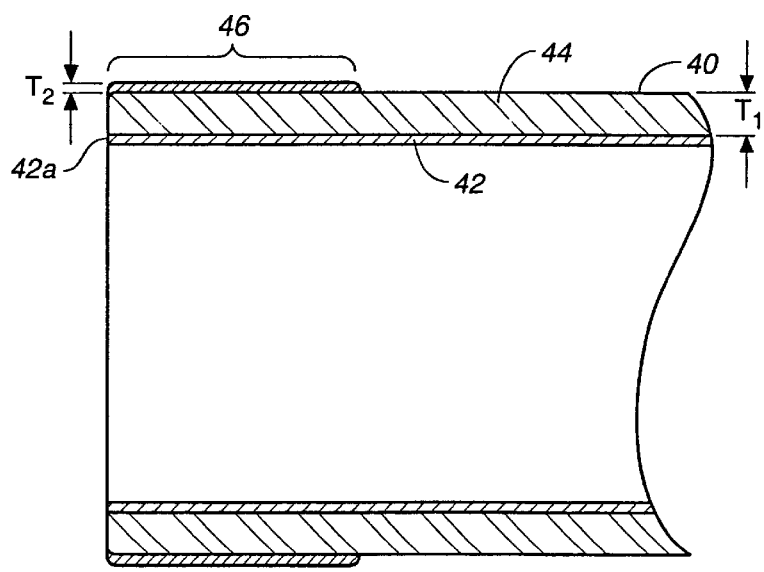
FIG._4

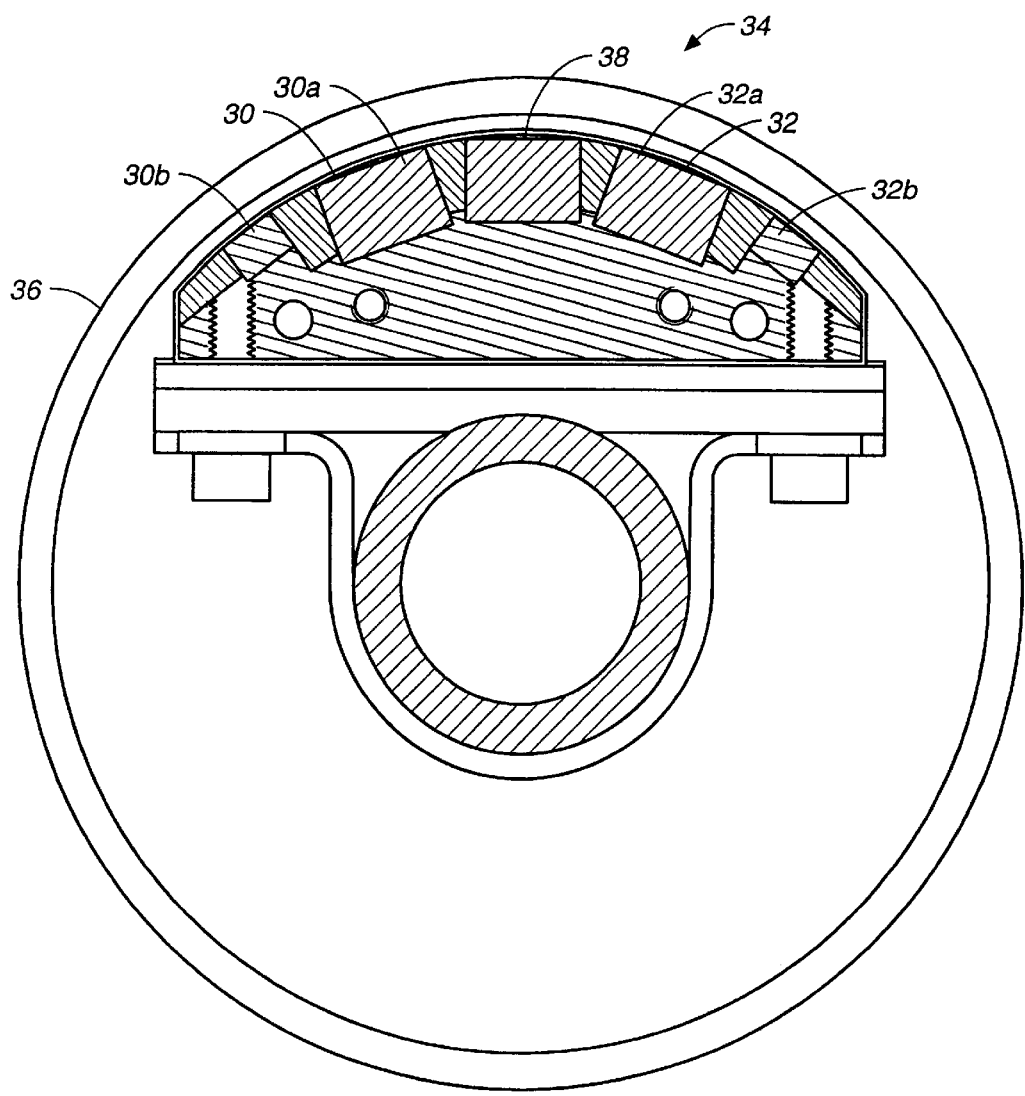
FIG._3

APPARATUS AND METHOD FOR SPUTTERING

BACKGROUND OF THE INVENTION

1. Field of the Invention

This invention relates generally to a rotating cylindrical magnetron apparatus, and more specifically to the magnetic structure or array used to provide a magnetic field or "race track" to sputter the material contained on the surface of the cylindrical magnetron target, and the configuration of the target material relative to the magnetic structure.

2. Description of the Prior Art

This invention relates directly to an apparatus used for magnetron sputtering utilizing rotating, cylindrical shaped targets (cathodes). The cylindrical targets are used to deposit various materials onto a variety of substrates. The materials are deposited in a vacuum chamber using a gas reactive magnetron sputtering technique. The principles and operation of such apparatus are described in detail in Boozenny et al. U.S. Pat. No. 5,096,062, describing a large-scale cylindrical sputtering apparatus (sold by Airco Coating Technology under the trademark "C-MAG") used for sputtering coatings onto architectural glass panels, automobile windshields, and the like. Further teachings pertaining to such apparatus are described in detail in Wolfe et al. U.S. Pat. No. 5,047,131.

In these prior patents, the magnetic structure or array (typically a closed loop) used to produce the magnetic field to confine the plasma is discussed, and the resulting sputtering area is referred to as the "race track". Two distinct magnetic arrays which are used to produce the "race track" are discussed, one being the "W" configuration and the other being the "U" configuration, both of which produce a singular "race track" for confining the plasma on a target's surface. The "race track" consists of two parallel lines running longitudinally across the target surface, and an area at each end of the magnetic structure commonly called the "turn-around" area. Together, the parallel lines and turn-arounds form a magnetic loop that comprises the "race track".

One of the claimed advantages for the rotating cylindrical target is the greater amount of material available for sputtering as compared to a planar magnetron target. In the case of the planar magnetron, the race track and target are in a static condition, therefore, the erosion groove along the race track is narrow, causing rapid depletion of the target material being sputtered within this localized area, and resulting in low material utilization (approximately 25%) before necessary replacement of the target. In the case of the rotating cylindrical target, because of its cylindrical shape and the fact that it rotates around a fixed magnet array, more target material is available to sputter and the target utilization is thus increased.

While the foregoing is true, the material utilization of the cylindrical targets, using the "W" or "U" magnet configurations, falls far short from the theoretical expectation of 85% to 95% of target material usage. In actuality the utilization for the cylindrical target is approximately 40%, making the cylindrical cathode much less advantageous than was originally anticipated. The reason the utilization ended up being less than expected was due to the localized areas at each end of the race track, called the turn-around areas. The turn-around area at each end of the race track has approximately 2.5 times the power density as compared to the medial area along the parallel lines running longitudinally across the target surface. As a result of the higher power density at the turn-around areas, the ends of the cylindrical target wear through (erode) more rapidly than the area between the turn-around areas.

Perhaps an obvious solution for the poor utilization might be to simply increase the target material thickness at the localized turn-around areas of the target. However, experimentation has shown that simply increasing the material thickness by 2.5 times while using the single magnetic race track configuration is not a feasible approach, because this methodology produces two undesirable effects. The first problem is the reduction of the magnetic field strength at the turn-around areas, which causes a loss of plasma confinement, and which can create instability in the plasma.

The second problem with this approach is that some of the sputter materials have too much internal stress, limiting the available thickness of the target material. This situation becomes evident when trying to apply increased thickness for Silicon target materials. As the Silicon thickness increases, so does the stress, and cracking or delamination of the target material results. This is particularly true when the Silicon target material is subjected to high power densities, as would be the situation with the single race track configuration at the turn-around areas. Therefore, in the case of Silicon targets, applying the "thicker end" methodology to exclusively overcome the erosion problem cannot be accomplished by itself, due to the high stress in thicker material located at the target ends. However, it is true that thicker material at the target ends can be used, but only in moderation, and not exclusively.

A further problem using the "W" or "U" magnet configurations of a single race track is that high power densities are concentrated onto the target surface due to the tight plasma confinement created by the magnetic field. This situation becomes apparent while considering low melting point materials (e.g., Zinc and Tin), or materials having a propensity for arcing (e.g., Silicon) at higher power densities. In the cases of the aforementioned materials it becomes desirable to distribute the power being applied to the target over a larger surface area, thereby reducing the localized areas of high power density.

OBJECTS AND ADVANTAGES

It is therefore an object of the present invention to improve the overall material utilization for a rotating cylindrical magnetron target, thereby reducing the effective target cost.

It is a further object of the present invention to improve the sputtering process conditions for cylindrical magnetron target materials such as Zinc, Tin, and Silicon to reduce the risk of melting and/or arcing.

SUMMARY OF THE INVENTION

The method and apparatus of this invention provides improved structural features and techniques used to accomplish the foregoing objectives for improving the material utilization and process stability for the rotating cylindrical magnetron targets used in a sputtering system.

The first methodology used in this invention is to incorporate an additional (i.e., second) magnet structure or "race track" immediately adjacent the first magnet structure or "race track". Having two distinct magnetic race tracks allows the power density on the target surface to be reduced by approximately 50% for any given point where magnetic confinement of the plasma exists, as compared to the single race track configuration. This double race track configuration, by itself, does not overcome the rapid erosion problem at the magnetic turn-around areas, as described above, but it does provide other advantages (discussed infra).

The second methodology recognizes that since the localized power density is reduced by the double "race track" configuration, the power density at the turn-around areas can be controlled by shifting (offsetting) one race track from the other, along the longitudinal axis of the race tracks and target, so that the ends of "turn-around" areas are offset from one another. As previously discussed, the single race track turn-around areas have approximately 2.5 times more power density than along the parallel and longitudinal race track lines in the medial portion of the target. Therefore, a properly offset dual race track configuration only has 1.25 times the power density at each turn-around area (relative to the longitudinal area), and because they are offset to each other, the erosion at the turn-around areas can thus be minimized to 1.25 times, as compared to the longitudinal areas between the magnetic turn-arounds. This methodology will thus yield approximately 80% target utilization, or an improvement of approximately two times the usable target material, as compared to the target utilization for the single race track configuration.

The third methodology used in this invention is to modestly increase the target material thickness at the ends of the target, and more specifically the material thickness at the turn-around areas being affected by the higher power densities of the plasma. The modest thickness increase (e.g., by approximately 1.25 times, to generally equate to the greater power density there) will then allow nearly all of the material between the turn-around areas to be sputtered. In this respect, when the ends of the target finally do deplete, the longitudinal area between the turn-arounds will also be depleted at approximately the same time.

Combining these three features of the invention, the first being the dual race track magnet structure, the second being the offset of these dual race tracks, and the third being modestly thicker material at the turn-around areas, will yield nearly 100% target utilization for a rotating cylindrical magnetron target.

BRIEF DESCRIPTION OF THE DRAWINGS

FIG. 1 is a top plan view of a pair of magnet arrays forming a dual race track magnet structure for the improved apparatus of this invention;

FIG. 2 is a cutaway top plan view of one end of a pair of offset magnet arrays forming an offset dual race track magnet structure for the improved apparatus of this invention, the other end being a mirror image;

FIG. 3 is an end elevation cross-sectional view of a pair of magnet arrays forming a dual race track magnet structure of this invention; and FIG. 4 is a cutaway front elevation cross-sectional view of one end of an improved cylindrical magnetron target of this invention, illustrating the increased material coating thickness incorporated onto the backing tube at the ends of the target.

DETAILED DESCRIPTION OF A PREFERRED EMBODIMENT

FIG. 1 is a top plan view of a pair of magnet arrays 10, 12 forming a dual race track magnet structure 14 for the improved apparatus of this invention. Placement of the second magnet array or "race track" 12 adjacent the first magnet array or "race track" 10 reduces the power density on the target surface by approximately fifty percent (relative to a single "race track" configuration). In this embodiment, the respective arrays 10, 12 are of equal overall length, immediately adjacent to each other, and not offset, so that the respective ends 10a, 12a and 10b, 12b are aligned.

FIG. 2 is a cutaway top plan view of one end of a pair of offset magnet arrays 20, 22 forming an offset dual race track magnet structure 24, the other end being a mirror image. The amount of the longitudinal offset 26 between the end 20a of magnet structure 20 and the end 22a of magnet structure 22 is preferably approximately two times the width W of the end magnet(s) 28, or 2:1. For example, if end magnet 28 has a width of approximately 7 millimeters, the preferred offset 26 should be approximately 14 millimeters.

This offset is desirable so that the turn-around areas of magnet arrays 20, 22 do not overlap. Any offset in the ends of these magnet structures is preferable to no offset, but beyond an offset of approximately two times the width of the end magnet (2:1) the arrangement begins to lose benefit. Furthermore, the upper limit of the offset is determined by the width of the glass or other substrate being treated by the target. Thus, the longitudinal offset between the magnet structures may range from 0 (1:1, or no offset), such as illustrated in FIG. 1, to the preferred offset of 2:1 (2 times the width of the end magnet, as illustrated in FIG. 2), to 3:1 or more.

FIG. 3 is an end elevation cross-sectional view of a pair of magnet arrays 30, 32 forming a dual race track structure 34. Structure 34 is supported within the central core of cylindrical magnetron target 36 (consisting of backing tube and material coating), as is well known in the art. In this embodiment, each array 30, 32 includes a pair of longitudinally-extending magnets 30a, 30b and 32a, 32b, respectively, and they share a common longitudinally-extending central magnet 38.

FIG. 4 is a cutaway front elevation cross-sectional view of one end of a cylindrical magnetron target 40 comprising a backing tube 42 having an end 42a, to be used with the dual offset rack track embodiment of FIG. 2. The backing tube is coated with a sputtering material 44 over its entire length to a first thickness $T_1$. Proximate the end 42a of the backing tube and target, this thickness is increased to a second thickness $T_2$. $T_2$ is preferably on the order of 1.25 times $T_1$ (1.25:1) to generally equate to the greater power density present at the turn-around areas at the ends of the target. This ratio may of course vary, from 1:1 (no increased thickness) to 1.5:1 or more.

The longitudinal extent 46 of this increased thickness area is preferably on the order of two times the width of the end magnet, or 2:1, as described as being the preferred amount of longitudinal offset of the respective magnet structures in FIG. 2. As before, this ratio may vary from 0 (1:1, or no extent of increased thickness), such as exists in the prior art, to the preferred longitudinal extent of 2:1 (two times the width of the end magnet, to generally comport with the turn-around area), to 3:1 or more (beyond which it is likely that the additional material would simply be wasted and left behind after the target had experienced burn-through at some other point along its length).

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims and equivalents.

What is claimed as invention is:

1. An apparatus for sputtering a cylindrical magnetron target, said cylindrical magnetron target having a central core and a surface, said apparatus comprising:
   a first magnetic race track structure placed in said central core and adjacent said target; and
   a second magnetic race track structure placed in said central core and adjacent said first magnetic race track structure and said target to reduce the power density on the target surface; said first magnetic race track structure being longitudinally offset relative to said second magnetic race track structure.

2. The apparatus for sputtering a magnetron target of claim 1 wherein said first magnetic race track structure includes an end magnet having a width, and said longitudinal offset is in an amount in the range of one to three times said end magnet width.

3. The apparatus for sputtering a magnetron target of claim 2 wherein said longitudinal offset is approximately two times said end magnet width.

4. An apparatus for sputtering a cylindrical magnetron target, said cylindrical magnetron target having a central core and a surface, said apparatus comprising:
   a first magnetic race track structure placed in said central core and adjacent said target; and
   a second magnetic race track structure placed in said central core and adjacent said first magnetic race track structure and said target to reduce the power density on the target surface; wherein said magnetron target has a length with a medial portion and a pair of end portions, and a target material thickness, and said target material thickness is from 1 to 1.5 times greater proximate said end portions than proximate said medial portion, and further wherein said first magnetic race track structure includes an end magnet having a width, and said target material thickness is greater for a lateral extent proximate said end portions in the range of one to three times said end magnet width.

5. The apparatus for sputtering a magnetron target of claim 4 wherein said target material thickness is approximately 1.25 times greater proximate said end portions than proximate said medial portion.

6. The apparatus for sputtering a magnetron target of claim 4 wherein said lateral extent is approximately two times said end magnet width.

7. The apparatus for sputtering a magnetron target of claim 1 wherein each of said first and second magnetic rack track structures include a pair of longitudinally-extending magnets.

8. The apparatus for sputtering a magnetron target of claim 7 wherein said first and second magnetic race track structures share a common central longitudinally-extending magnet.

9. A method for improving material utilization for a cylindrical magnetron target having a central core and a surface, said method comprising the steps of:
   placing a first magnetic race track structure in said central core and adjacent said target;
   placing a second magnetic race track structure in said central core and adjacent said first magnetic race track structure and said target to reduce the power density on the target surface; and
   longitudinally offsetting the placement of said first magnetic race track structure relative to said second magnetic race track structure.

10. The method for improving material utilization for a cylindrical magnetron target of claim 9 further including the step of providing said magnetron target with a length with a medial portion and a pair of end portions, and a target material thickness, and forming said material thickness to be from 1 to 1.5 times greater proximate said end portions than proximate said medial portion.

* * * * *